(12) United States Patent
Beers et al.

(10) Patent No.: US 6,224,726 B1
(45) Date of Patent: *May 1, 2001

(54) CATHODIC ARC COATING APPARATUS

(75) Inventors: Russell A. Beers, Palm Beach Gardens; Robert E. Hendricks, Port Saint Lucie, both of FL (US); Richard D. Getz, Avon, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/217,714

(22) Filed: Dec. 21, 1998

Related U.S. Application Data

(63) Continuation-in-part of application No. 08/919,132, filed on Aug. 30, 1997, now Pat. No. 6,036,828.

(51) Int. Cl.[7] ............................. C23C 14/32; C23C 14/50
(52) U.S. Cl. ................. 204/298.41; 204/192.38; 204/298.15; 204/298.23; 118/723 VE
(58) Field of Search ..................... 204/192.38, 298.41, 204/298.15, 298.21, 298.23, 298.27, 298.28; 118/729, 730, 723 VE

(56) References Cited

U.S. PATENT DOCUMENTS

| | | | | |
|---|---|---|---|---|
| 5,282,944 | * | 2/1994 | Sanders et al. | 204/192.38 |
| 5,363,400 | * | 11/1994 | Damond et al. | 204/298.41 |
| 5,380,420 | * | 1/1995 | Tsuji | 204/298.41 |
| 6,009,829 | * | 1/2000 | Ramalingam | 118/723 VE |
| 6,036,828 | * | 3/2000 | Beers et al. | 204/298.41 |

FOREIGN PATENT DOCUMENTS

| | | |
|---|---|---|
| WO 85/03954 | 9/1985 | (WO) . |
| WO 89/01699 | 2/1989 | (WO) . |

* cited by examiner

*Primary Examiner*—Rodney McDonald
(74) *Attorney, Agent, or Firm*—Richard D. Getz

(57) ABSTRACT

An apparatus for applying material by cathodic arc vapor deposition to a substrate is provided which includes a vessel, a disk-shaped cathode, a platter for supporting the substrate, apparatus for maintaining a vacuum in the vessel, and apparatus for selectively sustaining an arc of electrical energy between the cathode and an anode. The disk-shaped cathode has a first end surface, a second end surface, and an evaporative surface extending between the first and second end surfaces, and the cathode is mounted on a pedestal positioned inside the vessel. The platter has a slot for receiving the pedestal, thereby enabling the platter to be movable into and out of the vessel.

12 Claims, 3 Drawing Sheets

CATHODIC ARC COATING APPARATUS

Pursuant to 37 C.F.R. §1.53, the subject matter claimed herein is a continuation-in-part of an earlier filed application having a filing date of Aug. 30, 1997, and a U.S. patent application Ser. No. 08/919,132 now U.S. Pat. No. 6,036,828.

BACKGROUND OF THE INVENTION

1. Technical Field

This invention relates to apparatus for vapor deposition of coatings in general, and to cathodic arc vapor deposition apparatus in particular.

2. Background Information

Vapor deposition as a means for applying a coating to a substrate is a known art that includes processes such as chemical vapor deposition, physical vapor deposition, and cathodic arc vapor deposition. Chemical vapor deposition involves introducing reactive gaseous elements into a deposition chamber containing one or more substrates to be coated. Physical vapor deposition involves providing a source material and a substrate to be coated in an evacuated deposition chamber. The source material is converted into vapor by an energy input, such as heating by resistive, inductive, or electron beam means.

Cathodic arc vapor deposition involves a source material and a substrate to be coated placed in an evacuated deposition chamber. The chamber contains only a relatively small amount of gas. The negative lead of a direct current (DC) power supply is attached to the source material (hereinafter referred to as the "cathode") and the positive lead is attached to an anodic member. An arc-initiating trigger, at or near the same electrical potential as the anode, contacts the cathode and subsequently moves away from the cathode. When the trigger is still in close proximity to the cathode, the difference in electrical potential between the trigger and the cathode causes an arc of electricity to extend therebetween. As the trigger moves further away, the arc jumps between the cathode and the anodic chamber. The exact point, or points, where an arc touches the surface of the cathode is referred to as a cathode spot. Absent a steering mechanism, a cathode spot will move randomly about the surface of the cathode.

The energy deposited by the arc at a cathode spot is intense; on the order of $10^5$ to $10^7$ amperes per square centimeter with a duration of a few to several microseconds. The intensity of the energy raises the local temperature of the cathode spot to approximately equal that of the boiling point of the cathode material (at the evacuated chamber pressure). As a result, cathode material at the cathode spot vaporizes into a plasma containing atoms, molecules, ions, electrons, and particles. Positively charged ions liberated from the cathode are attracted toward any object within the deposition chamber having a negative electrical potential relative to the positively charged ion. Some deposition processes maintain the substrate to be coated at the same electrical potential as the anode. Other processes use a biasing source to lower the potential of the substrate and thereby make the substrate relatively more attractive to the positively charged ions. In either case, the substrate becomes coated with the vaporized material liberated from the cathode.

The random movement of the arc can sometimes lead to non-uniform erosion of the cathode, which in turn can limit the useful life of the cathode. To avoid non-uniform erosion, it is known to steer the arc relative to the cathode. U.S. Pat. Nos. 4,673,477, 4,849,088, and 5,037,522 are examples of patents that disclose apparatus for steering an arc relative to a cathode. Some prior art steers the arc by mechanically manipulating a magnetic field source relative to the cathode. Other prior art steers the arc by alternately electrically connecting a power supply lead between two ends of a cathode. In both these approaches, the speed of the arc relative to the cathode is limited by the speed of the apparatus manipulating the magnetic field source, or switching the power supply. Another limitation is the complexity of the switching mechanisms and the hardware necessary to manipulate a magnetic field source relative to the cathode. A person of skill in the art will recognize that a production coating environment is harsh and simplicity generally equates with reliability.

Presently available cathodic arc coaters typically use a cooled cathode fixed in place within the coater. One cooling scheme provides a manifold attached to the cathode that permits the passage of coolant between the cathode and manifold. Another scheme uses coolant piping connected to a hollow cathode. A problem with either scheme is that the cathode must be machined to accept the manifold or piping. Not all cathode materials are amenable to machining and even where possible, machining adds significantly to the cost of the consumable cathode. Another problem with "directly cooling" the cathode is the labor required to replace the cathode when its useful life has expired. In the previous example where a manifold (or piping) is mechanically attached to the cathode, the manifold (or piping) must be detached from the old cathode and attached to a new one, and the deposition chamber subsequently cleaned of coolant. For those applications which require cathode replacement after each coating run, the labor costs and down time can be considerable. Still another problem with direct cathode cooling is leakage. Coolant leakage occurring during deposition can contaminate the substrates being coated and require extensive cleaning within the deposition chamber. Airfoils for gas turbine engines are an example of an expensive substrate to be coated; one where it would be a distinct advantage to minimize or eliminate losses due to contamination.

In short, what is needed is an apparatus for cathodic arc vapor deposition of material on a substrate that operates efficiently, one capable of consistently providing a high quality coating on a substrate, one that optimizes cathode erosion, and one that operates cost effectively.

DISCLOSURE OF THE INVENTION

It is, therefore, an object of the present invention to provide an apparatus for cathodic arc vapor deposition of material on a substrate with a high deposition rate.

It is another object of the present invention to provide an apparatus for cathodic arc vapor deposition of material on a substrate that provides a uniform high quality coating on every substrate within the apparatus.

According to the present invention, an apparatus for applying material by cathodic arc vapor deposition to a substrate is provided which includes a vessel, a disk-shaped cathode, a platter for supporting the substrate, means for maintaining a vacuum in the vessel, and means for selectively sustaining an arc of electrical energy between the cathode and an anode. The disk-shaped cathode has a first end surface, a second end surface, and an evaporative surface extending between the first and second end surfaces, and the cathode is mounted on a pedestal positioned inside the vessel. The platter has a slot for receiving the pedestal, thereby enabling the platter to be movable into and out of the vessel.

An advantage of the present invention is its ability to place a relatively thick coating (75–150µ) on substrates aligned with the erosion surface of the cathode in a relatively short period of time. Several characteristics of the present invention, including the low length to diameter ratio (L/D) of the present invention cathode and the substrate position and rotation provided by the platter, enable the present invention apparatus to produce a relatively high deposition rate. The erosion of the cathode, which is directly related to the high deposition rate, is facilitated by providing a means for steering the arc around the erosion surface of the cathode and the cooling adjacent the cathode. This is particularly true in the embodiment where the aforesaid steering means and cooling are provided adjacent each end surface of the cathode.

Another advantage of the present invention is uniformity of the coating process. The means for steering the arc around the erosion surface of the cathode increases the uniformity of the erosion by steering the arc around the circumference of the cathode at a substantially constant velocity. The substrates disposed around and equally spaced from the cathode consequently receive a more uniform deposition of coating material. In addition, the velocity of the arc around the cathode circumference is a function of the strength of the magnetic field and the amount of current supplied. As a result, the velocity of the arc can be manipulated by changing the amount of current, the strength of the magnetic field, or both. This advantage is particularly apparent in those embodiments which utilize a steering means adjacent each end surface of the cathode.

These and other objects, features and advantages of the present invention will become apparent in light of the detailed description of the best mode embodiment thereof, as illustrated in the accompanying drawings.

BEST MODE FOR CARRYING OUT THE INVENTION

Figure 1:
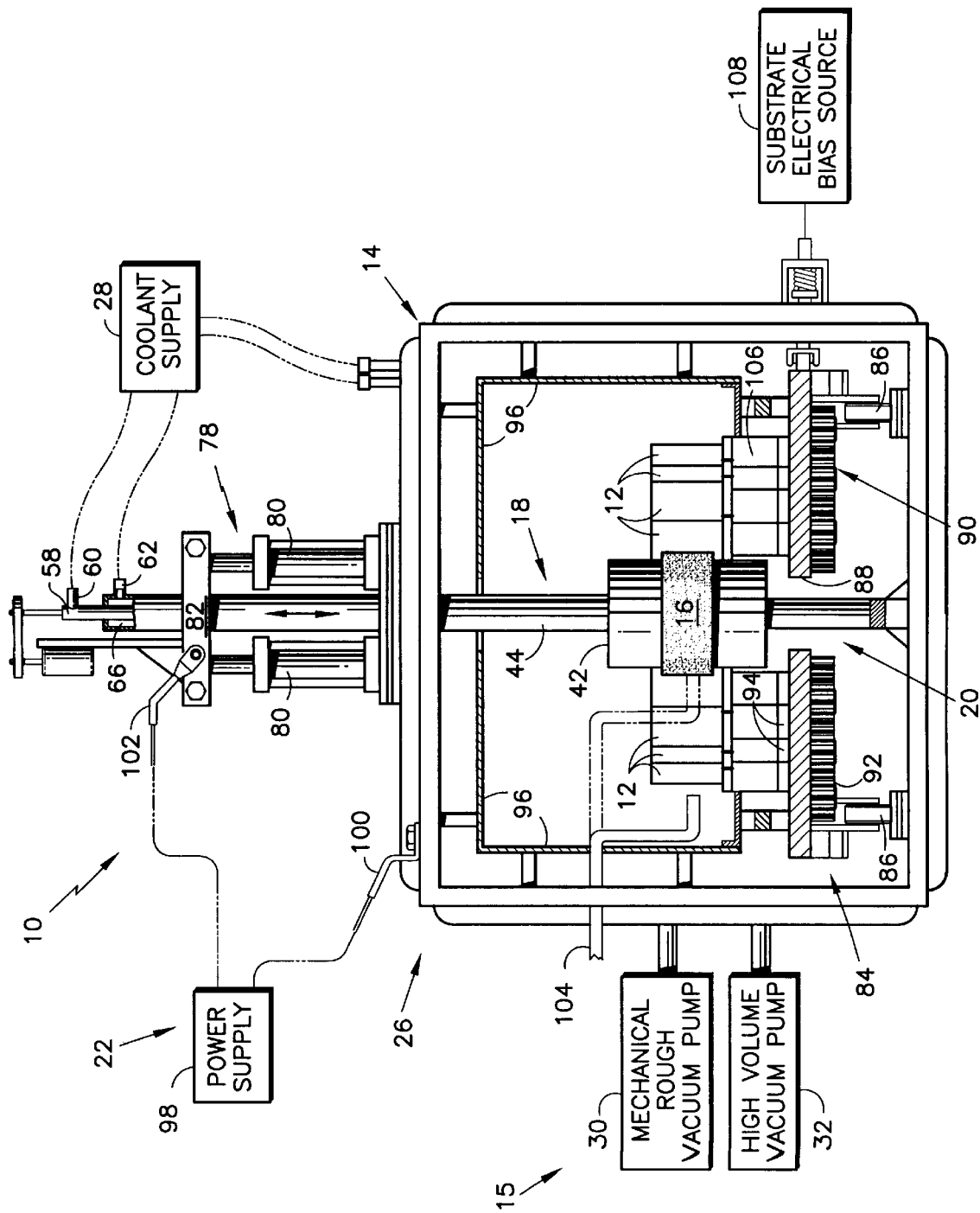
FIG. 1 is a diagrammatic view of the present invention cathodic arc vapor deposition apparatus.

Referring to FIG. 1, an apparatus 10 for cathodic arc vapor deposition on a substrate 12 (hereinafter referred to as a "cathodic arc coater") is provided having a vessel 14, means 15 for maintaining a vacuum in the vessel 14, a cathode 16, a contactor 18, a cathode support pedestal 20, and means 22 for sustaining an arc of electrical energy between the cathode 16 and an anode 26. A coolant supply 28 maintains the apparatus 10 within acceptable temperatures. In the preferred embodiment, the means 15 for maintaining a vacuum in the vessel 14 includes a mechanical rough vacuum pump 30 and a high volume diffusion vacuum pump 32 piped to the interior of the vessel 14. Other vacuum means may be used alternatively.

Figure 2:
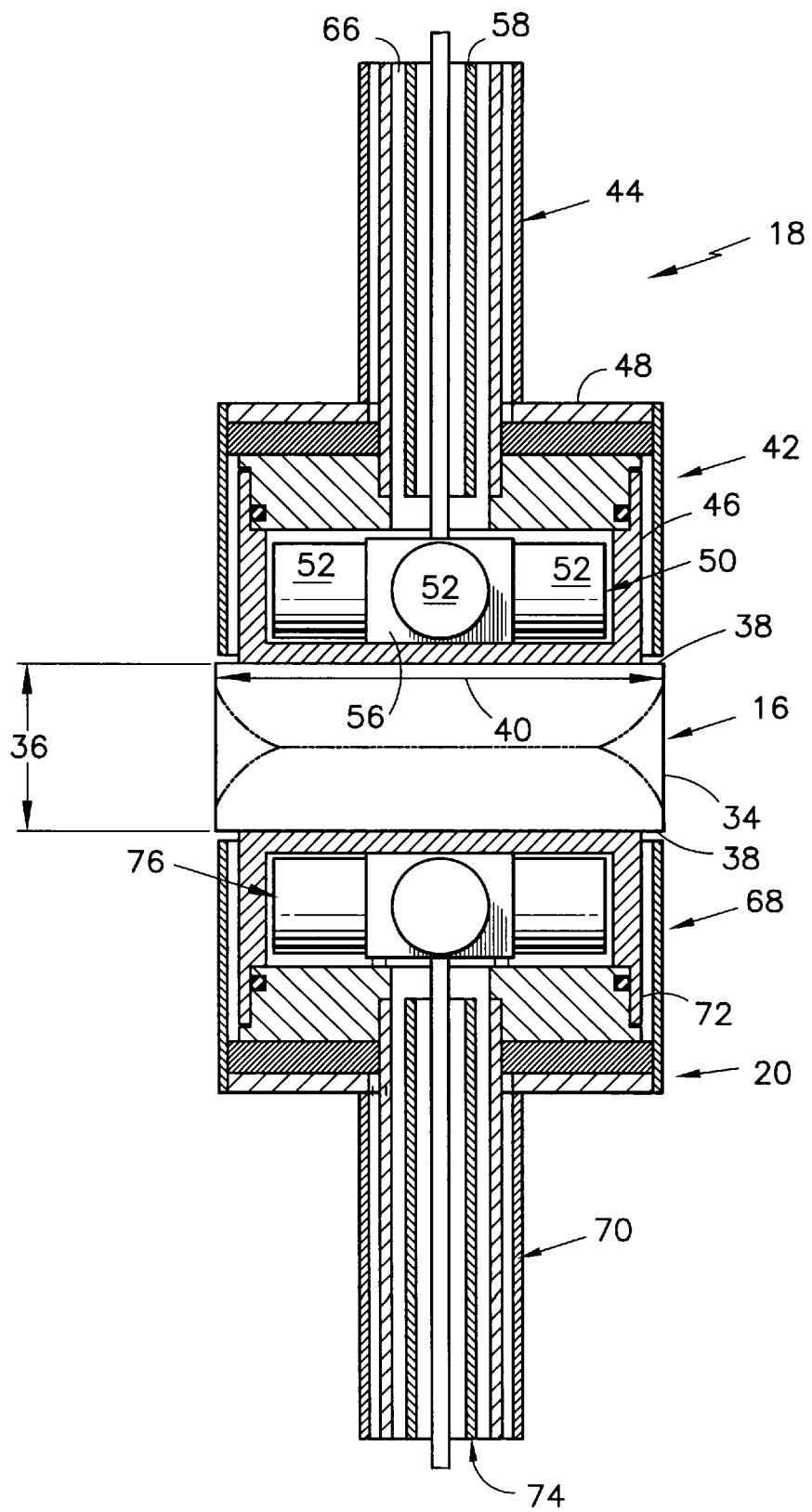
FIG. 2 is a diagrammatic cross-sectional view of a contactor, showing twin magnetic field generators.

Referring to FIG. 2, the cathode 16 is a cylindrical disk having an evaporative surface 34 that extends along a length 36 and a pair of end surfaces 38 that extend across a diameter 40. The length 36 over diameter 40 (L/D) ratio is preferably in the range of 3:1 to 1:3, and most preferably in the range of 2:1 to 1:2. The end surfaces 38 are substantially parallel with one another.

Referring to FIGS. 1 and 2, the contactor 18 includes a head 42 attached to a shaft 44. The head 42, which is positioned inside the vessel 14, includes a cup 46 and a shaft flange 48. The shaft flange 48 is fixed to the shaft 44 and the cup 46 is removably attached to the shaft flange 48. The shaft 44 extends from the head 42 to outside the vessel 14. The cup 46, shaft flange 48, and shaft 44 of the contactor 18 are fabricated from an electrically conductive material such as a copper alloy, but the contactor 18 itself is electrically insulated from the vessel 14. A magnetic field generator 50 is disposed inside the head 42 of the contactor 18. The magnetic field generator 50 includes a plurality of side magnets 52 and a center magnet (not shown), all attached to a ferromagnetic center piece 56. The side magnets 52 and center magnets are preferably permanent magnets, although alternative magnetic field sources such as electromagnetics may be used.

The contactor 18 preferably includes a cooling tube 58 coaxially positioned within the shaft 44, a coolant inlet port 60 connected to the cooling tube 62, and a coolant exit port 64 connected to the passage 66 formed between the coaxial coolant tube 58 and shaft 44. The coaxial arrangement between the cooling tube 58 and the shaft 44 allows coolant from the coolant supply 28 to enter the cooling tube 58 and return via the passage 66 between the shaft 44 and the cooling tube 58, or vice versa. The coolant inlet port 60 and exit port 64 are operably connected to the coolant supply 28.

Referring to FIG. 2, the cathode support pedestal 20 includes a head 68 attached to a shaft 70. The cathode 16 is placed on the pedestal 20, such that an end surface 38 is in contact with the head 68 of the pedestal 20. The pedestal 20 is electrically insulated from the cathode and/or from the vessel, depending upon the application. In the preferred embodiment, the head 68 and shaft 70 of the pedestal 20 are similar to that of the cathode 16, including a cup 72, cooling mechanism 74 and magnetic field generator 76.

Figure 3:
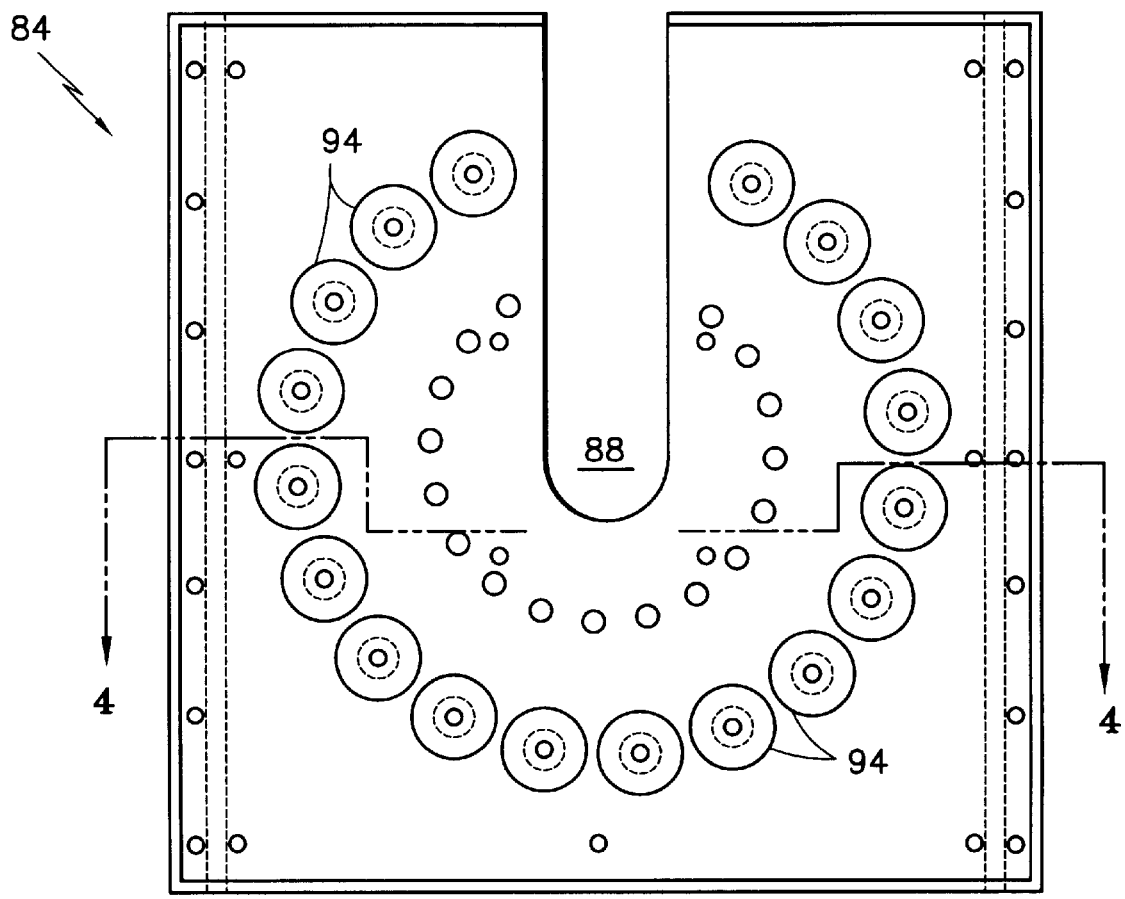
FIG. 3 is a diagrammatic top view of the platter.
Figure 4:
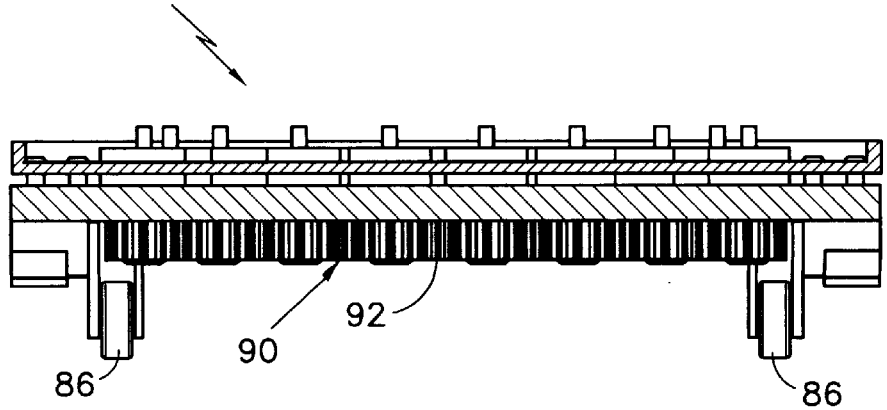
FIG. 4 is a diagrammatic sectional view of the platter shown in FIG. 3

Referring to FIG. 1, the cathodic arc coater 10 preferably includes an actuator 78 for selectively actuating the contactor 18 into electrical contact with the cathode 16. The actuator 78 includes a pair of two-way actuating cylinders 80 acting between the vessel 14 and a shaft flange 82 attached to the contactor shaft 44. FIG. 1 shows the cathode 16 disposed between the pedestal 20 and an actuating contactor 18. In an alternative embodiment, the pedestal 20 could actuate in manner similar to that of the contactor 18. The substrates 12 are mounted on a movable platter 84. The platter 84 (see FIGS. 3 and 4) includes a plurality of rollers 86, a slot 88 for receiving the pedestal 20, and means 90 for rotating the substrates 12. The means 90 for rotating the substrates 12 includes a plurality of interconnected gears 92, and substrate stations 94 attached to the gears 92. The interconnected gears 92 are selectively driven by a drive gear (not shown) located in the vessel 14. Deflector shields 96 are used throughout the coater 10 to confine the vaporized cathode materials in the area of the substrates 12. The deflector shields 96 attached to the vessel 14, platter 84, contactor 18 and the pedestal 20 also minimize undesirable material build-up on those surfaces. The means 22 for sustaining an arc of electrical energy between the cathode 16 and an anode 26 includes a direct current (D.C.) power supply 98. In the preferred embodiment, the positive lead 100 of the power supply 98 is connected to the vessel 14, thereby making the vessel 14 act as an anode. The negative lead 102 of the power supply 98 is electrically connected to the contactor shaft 44. An arc initiator 104, maintained at or near the electrical potential of the vessel 14, is used to initiate an arc.

Referring to FIG. 1, in the operation of an embodiment of the present invention, a cathode 16 is attached to the pedestal 20, and a plurality of substrates 12 are attached to the platter 84 which is subsequently loaded into the vessel 14. The platter 84 positions the substrates 12 around the cathode 16, and each substrate 12 is located at an appropriate height by a fixture 106 attached to the station 94. The contactor 18 is actuated into electrical contact with the cathode 16 and the vessel 14 is closed. The mechanical rough vacuum pump 30 evacuates the vessel 14 to a first pressure and the high volume diffusion vacuum pump 32 subsequently evacuates the vessel 14 to near vacuum conditions. Prior to initiating an arc several steps are completed, including: (1) the substrates 12 are electrically biased via a biasing source 108, making them electrically attractive to positive ions emitted from the cathode 16; (2) the substrates 12, mounted on the substrate stations 94, are rotated at a particular rotational speed; (3) the power supply 98 is adjusted to establish an arc having a particular magnitude of current and voltage, but no arc is initiated; and (4) coolant is cycled through the cooling passages within the vessel 14, contactor 18, and the pedestal 20. Specific process parameters will depend upon factors such as the substrate material, the material to be coated, and the desired characteristics of the coating, etc. Once the aforementioned steps have been completed, the arc initiator 104 is brought into and out of contact with the evaporative surface 34 of the cathode 16, causing an arc to jump between the arc initiator 104 and the evaporative surface 34. When the arc initiator 104 is no longer proximate the cathode 16, the arc jumps between the cathode 16 and the deflector shields 96 electrically connected to the vessel 14 (or directly between the cathode 16 and the vessel 14).

The magnetic field generator(s) 50 positioned in the contactor 18 (and the pedestal 20 in some embodiments—see FIG. 2) drives the cathode spot along the evaporative surface 34 of the cathode 16. To be more specific, the magnetic fields emanating from the magnetic field generator(s) 50 and the electric current of the arc create a force (the Hall effect) on the arc that causes the arc to travel a distance around the circumference of the cathode 16. Each side magnet 52 contributes to the magnetic field which collectively forces the arc to circle the cathode evaporative surface 34 along an arc path. The number of side magnets 52, the relative spacing of magnetic fields emanating from side magnets 52, and the intensity of those magnetic fields can be adjusted to satisfy the application at hand. The dwell time of the arc at any particular cathode spot is inversely related to the Hall effect force; i.e., an increase in the Hall effect force, causes a decrease in the dwell time. A person of skill in the art will recognize that decreasing the dwell time reduces the occurrence of macro-particles which can adversely effect the uniformity and surface finish of the deposited coating. The magnetic field generator(s) 50 of the present invention provide a means to minimize the occurrence of macroparticles.

The energy delivered by the arc causes the material at the cathode spot to vaporize, thereby liberating atoms, molecules, ions, electrons, and particles from the cathode 16. The biased substrates 12 attract the ions, causing them to accelerate toward the substrates 12. The ions strike the exterior surface of the substrates 12, attach, and collectively form a coating of the cathode material. When a coating of sufficient thickness has been deposited on the substrates 12, the power supply 98 is turned off and the arc extinguished. The vessel 14 is purged with inert gas and brought to ambient pressure. The contactor 18 is actuated out of contact with the cathode 16 and the platter 84 is removed from the vessel 14. The substrates 12 are subsequently removed from the platter 84, new substrates 12 attached, and a new cathode 16 is placed on the pedestal 20. The loaded platter 84 is inserted back into the vessel 14 in the manner described earlier and the process repeated.

Although this invention has been shown and described with respect to the detailed embodiments thereof, it will be understood by those skilled in the art that various changes in form and detail thereof may be made without departing from the spirit and the scope of the invention. For example, in some instances it may be advantageous to use a pedestal 20 without a contactor 18. In that embodiment, the pedestal 20 includes a magnetic field generator 50 and a cooling mechanism 74. The cathode 16 can be electrically and physically connected to the pedestal 20 and the pedestal 20 electrically insulated from the vessel 14.

We claim:

1. An apparatus for applying material by cathodic arc vapor deposition to a substrate, said apparatus comprising:
   a vessel;
   a disk-shaped cathode, having a first end surface, a second end surface, and an evaporative surface extending between said first and second end surfaces, wherein said cathode is mounted on a pedestal positioned inside said vessel;
   a platter, for supporting at least one substrate, said platter movable in and out of said vessel, wherein said platter has a slot, and said pedestal is received within said slot when said platter is positioned in said vessel;
   means for maintaining a vacuum in said vessel; and
   means for selectively sustaining an arc of electrical energy between said cathode and an anode.

2. An apparatus according to claim 1, wherein said pedestal comprises means for cooling said cathode, and wherein said first end surface of said cathode is in contact with said pedestal.

3. An apparatus according to claim 2, further comprising:
   means for driving said arc around said evaporative surface of said cathode.

4. An apparatus according to claim 3, wherein said means for driving said arc is disposed within said pedestal.

5. An apparatus according to claim 1, said apparatus further comprising:
   a contactor, positioned inside said vessel; and
   an actuator, for selectively actuating said contactor into contact with said second end surface of said cathode.

6. An apparatus according to claim 5, wherein said pedestal comprises a first means for cooling said cathode, and wherein said first end surface of said cathode is in contact with said pedestal.

7. An apparatus according to claim 6, further comprising:
   first means for driving said arc around said evaporative surface of said cathode.

8. An apparatus according to claim 7, wherein said first means for driving said arc is disposed within said pedestal.

9. An apparatus according to claim 8, wherein said contactor comprises second means for cooling said cathode.

10. An apparatus according to claim 9, further comprising:
    second means for driving said arc around said evaporative surface of said cathode, said second means disposed within said contactor.

11. An apparatus according to claim 5, wherein said contactor comprises second means for cooling said cathode.

12. An apparatus according to claim 11, further comprising:
    second means for driving said arc around said evaporative surface of said cathode, said second means disposed within said contactor.

* * * * *